US008288291B2

(12) United States Patent
Sioncke et al.

(10) Patent No.: US 8,288,291 B2
(45) Date of Patent: Oct. 16, 2012

(54) METHOD FOR REMOVAL OF BULK METAL CONTAMINATION FROM III-V SEMICONDUCTOR SUBSTRATES

(75) Inventors: Sonja Sioncke, Lubbeek (BE); Marc Meuris, Keerbergen (BE)

(73) Assignee: IMEC, Leuven (BE)

(*) Notice: Subject to any disclaimer, the term of this patent is extended or adjusted under 35 U.S.C. 154(b) by 826 days.

(21) Appl. No.: 12/021,006

(22) Filed: Jan. 28, 2008

(65) Prior Publication Data

US 2008/0214013 A1 Sep. 4, 2008

(30) Foreign Application Priority Data

Jan. 29, 2007 (EP) .................................... 07001836

(51) Int. Cl.
*H01L 21/302* (2006.01)
(52) U.S. Cl. ........ 438/745; 438/750; 438/753; 216/103; 134/1.2
(58) Field of Classification Search .................. 438/745, 438/750, 753, 754, 779; 216/83, 103, 10, 216/108; 134/1.1, 1.2, 3
See application file for complete search history.

(56) References Cited

U.S. PATENT DOCUMENTS

| 3,271,636 | A | | 9/1966 | Irvin |
| 3,600,242 | A | | 8/1971 | Berkenblit et al. |
| 3,969,164 | A | | 7/1976 | Cho et al. |
| 4,048,646 | A | | 9/1977 | Ogawa et al. |
| 4,493,142 | A | | 1/1985 | Hwang |
| 5,158,616 | A | * | 10/1992 | Kinoshita et al. ............ 134/25.4 |
| 5,696,023 | A | | 12/1997 | Holonyak et al. |
| 6,171,959 | B1 | | 1/2001 | Nagabushnam |
| 6,294,145 | B1 | | 9/2001 | Hall et al. |
| 6,348,157 | B1 | * | 2/2002 | Ohmi et al. .................... 210/760 |

(Continued)

FOREIGN PATENT DOCUMENTS

| EP | 0322244 A | 6/1989 |
| GB | 1233725 A | 5/1971 |
| JP | 62162327 | 7/1987 |
| WO | WO2006130439 | 12/2006 |

OTHER PUBLICATIONS

European Search Report dated Dec. 19, 2007 from application No. EP07001836.1.
Song, J.S. et al., "Wet Chemical Cleaning Process of GaAs Substrate for Ready-To-Use", Journal of Crystal Growth, vol. 264, 2004, pp. 98-103.

*Primary Examiner* — Lan Vinh
(74) *Attorney, Agent, or Firm* — McDonnell Boehnen Hulbert & Berghoff LLP

(57) ABSTRACT

The invention provides a single-step method for removing bulk metal contamination from III-V semiconductor substrates. The method comprises immersing a metal contaminated III-V semiconductor substrate in a mixture of sulfuric acid and peroxide with a volume ratio of sulfuric acid to peroxide (e.g., hydrogen peroxide) between about 3:1 and about 9:1. After treating the III-V semiconductor substrates with the sulfuric acid-peroxide mixture, the bulk metal contamination may be substantially removed from the substrate while a surface roughness of the substrate after treatment of below about 0.5 nm RMS (2 μm×2 μm) is obtained. The invention further provides a method for manufacturing a semiconductor device by removing bulk metal contamination according to the single-step method of the invention before performing processing steps for forming the semiconductor device.

15 Claims, 2 Drawing Sheets

U.S. PATENT DOCUMENTS

| | | |
|---|---|---|
| 6,432,836 B1 | 8/2002 | Watanabe |
| 6,458,711 B1 | 10/2002 | O'Brien et al. |
| 6,592,677 B1 | 7/2003 | Tomimori et al. |
| 6,631,022 B1 * | 10/2003 | Kihira et al. .................. 359/265 |
| 2004/0095896 A1 * | 5/2004 | Chudzik et al. ............... 370/254 |
| 2006/0186543 A1 * | 8/2006 | Rowell et al. .................. 257/741 |
| 2007/0018284 A1 * | 1/2007 | Nakayama et al. ........... 257/613 |
| 2007/0076773 A1 * | 4/2007 | Oh et al. ..................... 372/46.01 |
| 2007/0161248 A1 * | 7/2007 | Christenson et al. ......... 438/689 |

* cited by examiner (a)

(b)

(c)

(d)

METHOD FOR REMOVAL OF BULK METAL CONTAMINATION FROM III-V SEMICONDUCTOR SUBSTRATES

CROSS-REFERENCE TO RELATED APPLICATIONS

The application claims priority under 35 U.S.C. §119(a) to European Patent Application EP 07001836.1, filed on Jan. 29, 2007.

FIELD OF THE INVENTION

The present invention relates to a method for removing bulk metal (e.g., copper) contamination from a III-V semiconductor substrate (e.g., a GaAs substrate). The present invention furthermore relates to a method for manufacturing a semiconductor device using this method for removing bulk metal contamination from III-V semiconductor substrates.

BACKGROUND OF THE INVENTION

Over the past several years, numerous materials have been introduced for use in advanced CMOS processes to continue scaling and increase device performance. Among these materials are high-electron-mobility III-V compounds, which can be used as substrates for CMOS technology. When used as substrates for high performance devices, the III-V materials have to be compliant with the strict metal contamination specifications or requirements of a semiconductor manufacturing facility. Meeting these specifications or requirements is a challenge for the cleaning and the etching techniques employed, especially because the surface roughness of the cleaned substrate may not be affected.

LEC (liquid encapsulated Czochralsky) and VGF (vertical gradient freeze) are two of the main growth methods for III-V materials, e.g., GaAs materials. Very often GaAs substrates grown by these methods can show high metal contamination levels on the order of between $1 \times 10^{18}$ and $1 \times 10^{20}$ at/cm$^3$. These metal contaminations can include metals such as noble metals such as Au, Ag, Pt, and Cu, or can be include common metal contaminants such as Fe, Cr, Ni, and Zn. For example, in GaAs materials, the concentration of Cu contaminant can range from $1 \times 10^{19}$ up to $1 \times 10^{20}$ at/cm$^3$, especially within the 5-10 microns from the surface down to the bulk of the substrate. This is known as bulk Cu contamination and most likely originates from the polishing slurries used in the fabrication process. After a chemical-mechanical process step of the surface Cu, or in general the metal contaminant, rapidly diffuses deeply into the substrate, even at room temperature.

Other III-V materials besides GaAs, like GaP, GaSb, InAs, InP, InSb and combinations thereof may show similar high contamination levels as described above.

In order to clean the III-V semiconductor substrate or in other words, to remove the metal contaminants from the substrate, a thick layer of contaminated substrate needs to be removed, e.g. by etching, without metal re-plating occurring on the bare, e.g. etched, substrate afterwards. Re-plating is a phenomenon that may occur because noble metals like Cu and Au have high oxidation potentials and are able to oxidize the III-V semiconductor substrate. As a result, re-deposition of these noble metals from the cleaning solutions onto the III-V semiconductor substrate, also known as re-plating, can occur through a redox reaction. This behaviour makes the noble metals very hard to remove with standard chemistries.

Song, et al., J. of Crystal Growth 264, 98-103 (2004), discloses a method of treating GaAs surfaces to reduce Cu contamination. Nevertheless, GaAs substrates treated with their method showed a Cu concentration of about $12 \times 10^{10}$ Cu at/cm$^2$, which may yet be too high to be accepted in a semiconductor manufacturing facility. Moreover, their method may not entirely obviate the need for additional polishing followed by cleaning.

SUMMARY OF THE INVENTION

In one aspect, the present invention provides an effective method for removing bulk metal contamination from III-V semiconductor substrates. In another aspect, the present invention provides a method for manufacturing a semiconductor device using a method of the first aspect for removing bulk metal contamination from III-V semiconductor substrates.

Embodiments of the invention may result in III-V semiconductor substrates with no or substantially no bulk metal contamination and with good surface roughness. Thus, such embodiments may obviate the need for chemical-mechanical polishing and/or further cleaning steps before the substrates used in, for example, semiconductor processing (e.g., CMOS processing). Elimination of these steps can lead to decreased processing times and reduced processing costs.

In a first aspect of this invention, a single-step method for removing bulk metal contamination from a III-V semiconductor substrate is provided. The method comprises immersing a contaminated III-V semiconductor substrate in a mixture comprising sulfuric acid and peroxide, wherein the volume ratio of sulfuric acid to peroxide in the mixture comprising sulfuric acid and peroxide is between about 3:1 and about 9:1. In some embodiments, the peroxide is hydrogen peroxide $H_2O_2$. The hydrogen peroxide may be made by any suitable means, e.g., from $Na_2O_2$.

The concentration of the mixture is expressed as an x:y ratio, wherein x and y are real numbers and refer to volumetric portions for each component, i.e. x refers to a volumetric portion of $H_2SO_4$ and y refers to a volumetric portion of $H_2O_2$.

In some embodiments of the invention, a contaminated III-V substrate is treated, and the metal contamination is substantially removed from the substrate while the obtained surface roughness of the substrate after treatment is lower than about 0.5 nm RMS (Root Mean Square), or lower than about 0.3 nm RMS, or lower than 0.2 nm RMS for a surface grid of 2 μm×2 μm. "Substantially removed" implies that the concentration of the metal contaminant after treatment is as low as possible, for example, lower than the detection limit of a detection method and/or a detection device for the relevant metal contaminant.

In some embodiments, the III-V semiconductor substrates which have been treated do not require an additional polishing step and/or further cleaning steps before being used as substrates in, e.g., CMOS processing. In typical embodiments, the treatment method is a single-step method, which can decrease processing times and processing costs.

In some embodiments of the invention, the volume ratio of sulfuric acid to peroxide in the mixture comprising sulfuric acid and peroxide is between about 3:1 and about 6:1. In some embodiments, the peroxide is hydrogen peroxide.

In some embodiments of the invention, the volume ratio of sulfuric acid to peroxide in the mixture comprising sulfuric acid and peroxide is about 4:1. In such embodiments, an etch rate of between about 1.53 μm/min and about 2.63 μm/min may be obtained for non-stirred solutions with a temperature between about 65° C. and about 95° C., and an etch rate of between about 2.2 μm/min and about 3.1 μm/min may be obtained for stirred solutions with a temperature between about 45° C. and about 65° C.

In some embodiments, the method may be performed in a mixture of sulfuric acid and peroxide having a temperature between about 45° C. and about 95° C.

In some embodiments, the method may be performed in a mixture consisting of sulfuric acid and peroxide having a temperature between about 80° C. and about 95° C.

In some embodiments, the method may be performed with a mixture of sulfuric acid and peroxide that has an etch rate between about 2 µm/min and about 6 µm/min.

In some embodiments, the method may further comprise stirring the mixture of sulfuric acid and peroxide during immersion of a contaminated III-V semiconductor substrate in the mixture.

In some embodiments, the method may further comprise mechanically agitating the mixture of sulfuric acid and peroxide during immersion of the contaminated III-V semiconductor substrate in the mixture.

In some embodiments, the method may further comprise, immediately before immersing the contaminated III-V semiconductor substrate in the mixture of sulfuric acid and peroxide, freshly preparing the mixture of sulfuric acid and peroxide by: (1) preparing a mixture by mixing sulfuric acid and peroxide in a volume ratio between about 3:1 and about 9:1; and (2) while stirring, cooling down the freshly prepared mixture to obtain a homogeneous temperature distribution.

In some embodiments, after preparing the mixture of sulphuric acid and peroxide, the III-V semiconductor substrate may immediately (or at least as soon as possible) be immersed into the mixture. The immersion of the substrate shortly after mixing reduces potential decomposition of the peroxide. Thus, in typical embodiments, the method is performed with freshly prepared mixtures comprising of sulfuric acid and peroxide.

In some embodiments, the III-V semiconductor substrate is selected from GaAs, GaP, GaSb, InAs, InP, InSb, or a combination thereof. In some embodiments, the III-V semiconductor substrate comprises GaAs.

In some embodiments, the metal bulk contamination comprises a noble metal such as, e.g., Au, Ag, Pt, or Cu. In some embodiments, the metal bulk contamination comprises any of the common metals Fe, Ni or Zn. In some embodiments, the metal bulk contamination comprises Cu.

In a second aspect of this invention, the use of a method for removing bulk metal contamination from a III-V semiconductor substrate in semiconductor processing is provided.

In yet a further aspect of the invention, a method is provided for manufacturing a semiconductor device. The method comprises: (1) providing a III-V semiconductor substrate; and (2) treating the III-V semiconductor substrate with the method for removing bulk metal contamination according to the first aspect of the invention, before performing further processing steps to manufacture the semiconductor device.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILED DESCRIPTION OF THE INVENTION

Figure 1:
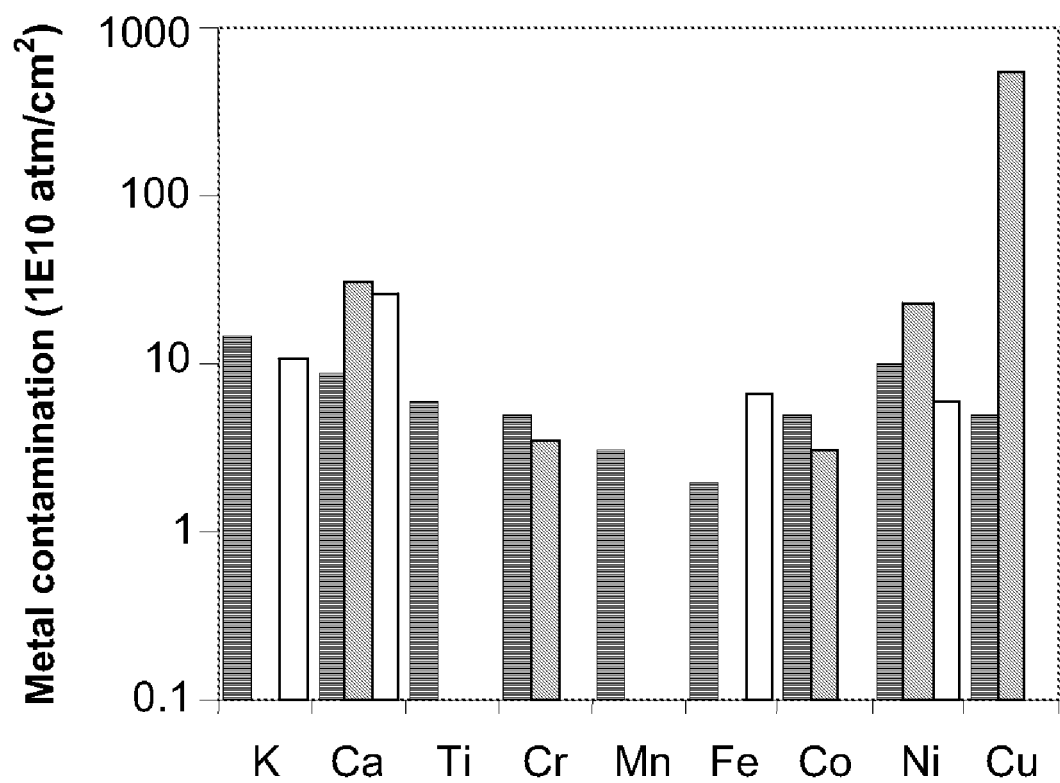
FIG. 1 shows metal contamination levels on GaAs substrates before and after etching the substrate with the mixture of sulfuric acid and peroxide.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may do so. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

The present invention provides a single-step method for removing bulk metal contamination, such as, e.g., noble metal contamination or common metal contamination, from a III-V semiconductor substrate, such as, e.g., GaAs, GaP, GaSb, InAs, InP, InSb, and the like. To be useful in semiconductor manufacturing processes, the method should comply with the following conditions: (a) the method should remove a thick layer, e.g., at least about 2 μm, or at least about 5 μm, or at least about 10 μm, and up to about 10 μm, or up to about 15 μm, or up to about 20 μm, or up to about 30 μm, or up to about 50 μm of contaminated substrate with a high etch rate such that only a treatment time below about 10 minutes, or below about 5 minutes, is necessary to substantially remove the contaminated part of the III-V semiconductor substrate (manufacturing friendly, low cycle-time), where the thickness of the layer to be removed is dependent on the type of metal contaminant and its speed of diffusion in the bulk of the substrate; (b) the method should result in a smooth surface, having a final roughness compatible with the most advanced process technology nodes, e.g., a surface roughness expressed as a Root Mean Square (RMS) value of about 0.5 nm or less for a surface grid of 2 μm×2 μm; and (c) the method should remove bulk metal contamination, especially noble metal contamination, without re-plating.

The present invention provides a method that comprises immersing a contaminated III-V semiconductor substrate in a mixture of sulfuric acid and peroxide. In some embodiments, the mixture of sulfuric acid and peroxide has a volume ratio of sulfuric acid to peroxide between about 3:1 and about 9:1, or between about 4:1 and about 8:1, or between about 4:1 and about 6:1. In some embodiments, the peroxide is hydrogen peroxide.

The concentration of the mixture is expressed as an x:y ratio, wherein x and y are real numbers and refer to volumetric portions for each component, i.e. x refers to a volumetric portion of $H_2SO_4$ and y refers to a volumetric portion of peroxide, such as $H_2O_2$.

In some embodiments, the mixture of sulfuric acid and peroxide (e.g., $H_2SO_4$ and $H_2O_2$) has a sulfuric acid to peroxide volume ratio between about 3:1 and about 9:1, or between about 4:1 and about 8:1, or between about 4:1 and 6:1, and may show a polishing effect. This means that immersing a III-V semiconductor substrate, e.g., GaAs, in such a mixture of sulfuric acid and peroxide results in a ready-to-use substrate surface. By "ready-to-use substrate surface" is meant that the surface of the III-V semiconductor substrate shows a good roughness which is as good as or better than that of the initial polished surface or, in other words, the surface before performing the method (see below). Therefore, in some embodiments, the method does not require additional polishing or cleaning steps. In some embodiments, the roughness of the surface of the III-V semiconductor substrate after immersion in the mixture of sulfuric acid and peroxide may be lower than about 0.5 nm RMS, or lower than about 0.3 nm RMS, or lower than about 0.2 nm RMS for a surface grid of 2 μm×2 μm.

It has been shown (see below) that, the more that the $H_2SO_4$ is diluted with $H_2O_2$, worse results are obtained, e.g., higher values for the roughness of the surface of the III-V semiconductor substrate result. Thus, if the ratio of $H_2SO_4$ to peroxide is too low, an additional polishing step may be required for obtaining a substrate which fulfils the requirements of roughness for further processing of, e.g., a semiconductor device. This is not advantageous in semiconductor processing as any additional step can raise the costs.

Etching of III-V substrates, and especially GaAs substrates, is known to be done with $H_2SO_4/H_2O_2/H_2O$. Various compositions have been used, but none of them has been found suitable for removing bulk metal contamination while also rendering a surface roughness of lower than about 0.5 nm RMS (Root Mean Square), or lower than about 0.3 nm RMS, or lower than about 0.2 nm RMS for a surface grid of 2 μm×2 μm without requirement for additional polishing steps and/or extra cleaning steps.

The wet chemical solutions known to remove metal contamination and especially noble metal contamination from a III-V semiconductor surface make use of acidic oxidation agents with high electronegativity, like HCl and HF, as was described above. The higher their electronegativity is, the more efficient they are for the removal of metal contaminants such as, e.g., Cu. In order to remove bulk metal contamination, a thick substrate layer, e.g., of about 10 μm or more, should be etched in a manufacturing-friendly time interval (see above), which means using concentrated solutions. However, previous experiments showed that using concentrated HF or HCl mixtures result in rough GaAs substrates with a roughness of higher than 0.5 nm RMS, which are not compatible with advanced semiconductor device processing.

Therefore the fact that bulk noble metal contamination is substantially removed by using sulfuric peroxide mixtures, a compound less electronegative than the above-mentioned acids, is unexpected and surprising. Moreover, the method offers the advantage of a single step treatment, without further requirement on polishing or cleaning steps, since the surface roughness of the substrate after treatment may be lower than about 0.5 nm RMS, or lower than about 0.3 nm RMS, or lower than about 0.2 nm RMS for a surface grid of 2 μm×2 μm.

Hence, with the method according to embodiments of the present invention, a III-V semiconductor substrate, e.g., a GaAs substrate, with no or substantially no bulk metal contamination left and with a good surface roughness, and which can be directly used in further manufacturing of semiconductor devices can be obtained in one single step. With no or substantially no bulk metal contamination is meant that the concentration of the metal contaminant after treating with the method according to embodiments of the present invention is as low as possible, preferably lower than the detection limit of a detection method and/or detection device for the relevant metal contaminant. With a good surface roughness is meant a surface roughness of lower than about 0.5 nm RMS, or lower than about 0.3 nm RMS, or lower than about 0.2 nm RMS for a surface grid of 2 μm×2 μm.

In some embodiments, the mixture of sulfuric acid and peroxide may have a volume ratio of sulfuric acid to hydrogen peroxide of about 4:1. It has been found that these mixtures are very efficient in removing bulk metal contamination from the III-V substrates and, in particular, from a GaAs substrate, and result in a surface showing good roughness, e.g., showing a roughness lower than about 0.5 nm RMS, or lower than about 0.3 nm RMS, or lower than about 0.2 nm RMS depending on the temperature of the mixture and on whether the mixture was stirred or not during immersion of the substrate in the mixture.

The invention provides a method for removing bulk metal contamination, such as noble metal contamination (e.g., Au, Ag, Pt, Cu), but also any other metal contamination such as Fe, Ni, or Zn contamination from a III-V semiconductor substrate such as, e.g., a GaAs, GaP, GaSb, InAs, InP, or InSb substrate.

According to embodiments of the present invention, the single-step method may further comprise, before immersing the III-V semiconductor substrate, e.g., a GaAs substrate, in the mixture of sulfuric acid and peroxide, freshly preparing the mixture by mixing sulfuric acid and peroxide in a volume ratio of sulfuric acid to hydrogen peroxide between about 3:1 and about 9:1, or between about 4:1 and about 8:1, or between about 4:1 and about 6:1, and cooling down the freshly prepared mixture while stirring it to get a homogeneous temperature distribution. In some embodiments, the sulfuric acid is an about 96 wt % sulfuric acid solution and the peroxide is an about 30 wt % solution of hydrogen peroxide. In some embodiments, after preparing the mixture, the III-V semiconductor substrate, e.g., a GaAs substrate, may immediately or at least as soon as possible, be immersed into the mixture. This reduces the opportunity for the mixture to degrade (or decrease in effectiveness) because of decomposition of the peroxide. Thus, in some embodiments, the method is performed with freshly prepared mixtures of sulfuric acid and peroxide.

The following examples illustrate specific embodiments of the invention, but are not intended to be limiting of the claims or of claim terms in any manner whatsoever.

All experiments referred to hereinafter are performed on 2-inch GaAs substrates (wafers), undoped, with (100) orientation, as supplied by CMK Ltd. (Slovakia). Therefore, the further description of the method according to the present invention will be done by means of GaAs substrates. One of skill in the art, however, would understood that the invention is not intended to be limited to GaAs substrates, and that various embodiments of the invention may also use any other suitable III-V semiconductor materials (described above) as substrates.

The level of metal contamination on the surface of the as-received GaAs wafers was measured with straight Total Reflection X-Ray Spectroscopy (TXRF). The initial level of metal contamination of a representative sample is shown in TABLE 1. As can be seen, especially Cu, Ni and Ca show high concentration values, but occasionally high concentrations of Fe may also be possible.

Typical values for Cu bulk contamination may be between $1 \times 10^{12}$ at/cm$^2$ and $1 \times 10^{13}$ at/cm$^2$, but may in some cases, depending on the manufacturing method of the semiconductor material, be as high as between $10^{18}$ and $10^{20}$ at/cm$^2$, while concentration values for Fe and Ni may mostly be below $1 \times 10^{12}$ at/cm$^2$.

TABLE 1

Initial bulk metal contamination levels on a typical as-received wafer and corresponding detection limits (DL) for different elements measured with TXRF.

| Metal | Initial concentration ($1 \times 10^{10}$ at/cm2) | Detection Limit DL ($1 \times 10^{10}$ at/cm2) |
|---|---|---|
| K | <DL | 15 |
| Ca | 30.0 | 9 |
| Sc | <DL | 5 |
| Ti | <DL | 6 |
| V | <DL | 4 |
| Cr | <DL | 5 |
| Mn | <DL | 3 |
| Fe | <DL | 10 |
| Co | <DL | 5 |
| Ni | 23.1 | 10 |
| Cu | 540.8 | 5 |

Metals, and especially noble metals, may diffuse fast in the bulk of a GaAs substrate. It has been observed that for Cu, which is one of the most rapidly diffusing elements, the contaminants can be present in the bulk of the substrate to about 10 microns deep from the substrate surface. Therefore, in order to substantially remove all Cu contaminants, at least about 10 microns of an upper part of the substrate should be removed.

A single-step method to substantially remove metal bulk contamination from the GaAs substrate and to obtain a good surface roughness without any further polishing or cleaning steps being required may comprise the following steps: (1) freshly preparing a mixture by mixing sulfuric acid and peroxide in a volume ratio of sulruric acid to hydrogen peroxide between about 3:1 and about 9:1, or between about 4:1 and 8:1, or between about 4:1 and about 6:1; (2) cooling down the freshly prepared mixture while stirring it to get a homogeneous temperature distribution; (3) placing at least one GaAs wafer in a holder; (4) immersing the holder with the at least one GaAs wafer in a bath comprising the mixture of sulfuric acid and peroxide; and (5) rinsing the wafers with deionized water (DIW) and drying the remaining droplets with, e.g., a N$_2$ gun.

Because the properties of the mixture of sulfuric acid and peroxide may rapidly decrease because of, e.g., decomposition of the mixture, the mixtures used to treat the wafers may, in typical embodiments, be freshly prepared and used immediately (or at least as soon as possible) after preparation in order to obtain the best possible results.

By "freshly prepared" is meant that the mixture of sulfuric acid and peroxide is prepared just before treating the semiconductor wafer with the mixture. In some embodiments, the mixture is prepared not more than about 30 min., or not more than about 15 min., or not more than about 10 min., or not more than about 5 minutes before the treating a semiconductor wafer with the mixture.

In some embodiments, mixtures of sulfuric acid and peroxide have a fixed volume ratio of sulfuric acid to hydrogen peroxide of about 4:1 so as to determine the effect of certain parameters of the method, such as, e.g., temperature, stirring and mechanical agitation, on the resulting properties of the substrate surfaces.

The different samples used for these experiments are indicated with GAS_W01 to GAS_W14. All different samples were treated with a mixture of sulfuric acid and peroxide containing four volume units or volumetric portions of H$_2$SO$_4$ (96 wt %) and 1 volume unit or volumetric portion of H$_2$O$_2$ (30 wt %). After being immersed in the mixture of sulfuric acid and peroxide, all samples were rinsed for 3 minutes in an overflow bath with de-ionized water (DIW) and during this rinsing step a quick dump rinse was done every minute in order to remove the sulfates more efficiently. With dump rinse is meant that after one minute the wafer is removed from the de-ionized water and then quickly put back in the de-ionized water for another minute. This may be repeated as many times as necessary, and according to the example given was performed three times (3 minutes of rinsing).

According to embodiments of the present invention, the mixture of sulfuric acid and peroxide may be stirred during immersion of the GaAs substrate in the mixture. According to these embodiments, stirring may be done with a magnetic stirrer at 170 RPM. Stirring the mixture during immersion of the GaAs substrate may lead to higher etch rates (see table 2).

In some embodiments, the mixture of sulfuric acid and peroxide may be may be mechanically agitated during immersion of the GaAs substrate in the mixture. Mechanical agitation may, for example, be performed by manually or automate swinging the holder containing the wafers in a direction parallel with the wafer surface in a bath containing the mixture of sulfuric acid and peroxide. Mechanical agitation may lead to even higher etch rates with respect to the embodiments where the mixture is stirred during immersion of the GaAs substrate (see TABLE 2).

TABLE 2 gives an overview of the experimental conditions employed and the corresponding etch rates which can be obtained under the specified experimental conditions.

TABLE 2

Experimental conditions tested and the corresponding etch rates.

| Sample label | Etching mixture | Volume ratio | Mechanical conditions | T (° C.) | Etch rate (μm/min) |
|---|---|---|---|---|---|
| GAS_W01 | $H_2SO_4:H_2O_2$ | 4:1 | Unstirred | 23 | 0.39 |
| GAS_W02 | | | | 25 | 0.41 |
| GAS_W03 | | | | 65 | 1.53 |
| GAS_W04 | | | | 72 | 2.17 |
| GAS_W05 | | | | 85 | 2.01 |
| GAS_W06 | | | | 92 | 2.93 |
| GAS_W07 | | | | 95 | 2.63 |
| GAS_W08 | $H_2SO_4:H_2O_2$ | 4:1 | Stirred | 45 | 2.2 |
| GAS_W09 | | | | 50 | 2.5 |
| GAS_W10 | | | | 60 | 3.1 |
| GAS_W11 | | | | 65 | 2.4 |
| GAS_W12 | $H_2SO_4:H_2O_2$ | 4:1 | Mechanical agitation | 80 | 3.7 |
| GAS_W13 | | | | 87 | 4.7 |
| GAS_W14 | | | | 90 | 5.3 |
| GAS_W15 | $H_2SO_4:H_2O_2$ | 9:1 | Stirred | 90 | 2.97 |
| GAS_W16 | | 7:3 | | 90 | 10.15 |
| GAS_W17 | | 6:4 | | 90 | 15.8 |
| GAS_W18 | | 5:5 | | 90 | 28.12 |
| GAS_W19 | $H_2SO_4:H_2O_2:H_2O$ | 22:40:38 | Unstirred | 23 | 7.02 |
| GAS_W20 | | | Stirred | 23 | 8.96 |
| GAS_W21 | $H_2SO_4:H_2O_2:H_2O$ | 45:20:35 | Unstirred | 28 | 2.36 |
| GAS_W22 | | | Stirred | 23 | 4.88 |

From TABLE 2, it can be seen that for unstirred solutions with a volume ratio $H_2SO_4:H_2O_2$ of 4:1 and temperatures between 23° C. to 95° C. (samples GAS_W01 to GAS_W07) the etch rates obtained under these circumstances may range from 0.39 μm/min to 2.93 μm/min. The etch rates obtained at 23° C. and 25° C. are too low to be used when a thick layer of GaAs should be removed from a high number of substrates, like in real manufacturing, as this would take too much time. It can be seen that, when the mixture of sulfuric acid and peroxide is kept at temperatures between 65° C. and 95° C. the etch rates are higher than at room temperature. Hence, these temperatures are suitable for being used with the method according to embodiments of the present invention. Most preferably, the temperature of the sulfuric acid/peroxide mixture may be between 85° C. and 95° C. because in these cases etch rates of between 2.01 and 2.93 μm/min can be obtained. This is advantageous for being used in real manufacturing of, for example, semiconductor devices because performance time can be reduced.

For stirred mixtures with a volume ratio $H_2SO_4:H_2O_2$ of 4:1 and temperatures between 45° C. to 65° C. (samples GAS_W08 to GAS_W11) the etch rates may range from 2.2 μm/min to 3.1 μm/minute depending on the temperature. Such etch rates might be advantageous in the manufacturing process of, for example, semiconductor devices, in terms of process time needed to remove the contaminated part of the GaAs substrate, although the etch rate is still rather low for removing thick layers of GaAs of e.g. 10 μm on a high number of samples in an acceptable time range.

From TABLE 2 it can be seen that the best results may be obtained with a mechanically agitated mixture of sulfuric acid and peroxide with a volume ratio $H_2SO_4:H_2O_2$ of 4:1 and temperatures between 80° C. to 90° C. (samples GAS_W12 to GAS_W14). The etch rates which may be obtained under these circumstances may range from 3.7 μm/min to 5.3 μm/min. The etch rates obtained under these circumstances are suitable to remove thick layers, i.e. in the order of between 10 μm and 15 μm of GaAs or another III-V semiconductor substrate within a time period of 10 minutes, preferably 5 minutes and more preferably 3 minutes. This makes the method according to these embodiments suitable for being used in semiconductor manufacturing where duration of processing steps, and thus costs, may be important. Industrially, mechanical agitation can be performed by, for example, using a robot arm which can move the holder containing the wafers back and forth inside the bath comprising the mixture of sulfuric acid and peroxide, in a direction parallel to the wafer surface.

Irrespective of the mechanical conditions and the temperature choice, the metal bulk contamination may be substantially completely removed in all the cases.

Total Reflection X-Ray Fluorescence (TXRF) measurements were performed on the samples treated as described above. These measurements show metal bulk concentrations below or around the detection limit for all metals which were initially present in the sample GaAs substrates, irrespective of the initial metal contamination value.

In general, irrespective whether the mixture is stirred, or not stirred or mechanically agitated, the temperature of the mixture of sulfuric acid and peroxide may, in some embodiments, be between about 45° C. and about 95° C., or between about 80° C. and about 95° C.

According to a specific example, the mixture of sulfuric acid and peroxide may have a volume ratio of 4:1 and a temperature of 90° C. The GaAs substrates were put in a holder and immersed in the sulfuric acid and peroxide mixture and subsequently mechanically agitated for 2 minutes, followed by rinsing in an overflow bath with de-ionized water for 3 minutes, with quick dump rinse every minute and drying. Thereafter the metal contamination level was measured with TXRF.

FIG. 1 compares the metal contamination levels after treatment of a GaAs substrate with the mixture of sulfuric acid and peroxide according to embodiments of the present invention (white bars) with initial values of the metal bulk contamination (bars filled with slanted lines), measured by TXRF. With initial values is meant the values for metal bulk contamination of the GaAs before being treated with the mixture of sulfuric acid and peroxide according to embodiments of the invention. In this figure, the detection limit (DL) is indicated with bars filled with horizontal lines. The absence of a bar (white or hatched with slanted lines) indicates that the concentration for that particular metal after, respectively before treatment in accordance with embodiments of the present invention is much lower than the detection limit (DL). When the value is close to the detection limit, even if it is slightly lower (like in the case of Ni in the figure) the measurement is still quantitative and the bar is shown on the picture. As can be seen, Cu, Co, Cr and Ni contamination is removed below the detection limit, which is about $5 \times 10^{10}$ at/cm$^2$.

The roughness of the initial substrate, i.e. the substrate before treatment with the mixture of sulfuric acid and peroxide as described above, and of the substrate after the contamination removal treatment according to embodiments of the present invention was measured with Atomic Force Microscopy (AFM) and the results are summarized in TABLE 3.

The GaAs substrate subjected to the single-step contamination removal treatment according to embodiments of the present invention (indicated by SPM (sulfuric acid/peroxide mixture)) shows an improved surface quality with respect to the initial substrate. As shown in TABLE 3, the initial GaAs surface may have a roughness of 0.243 nm RMS (2 μm×2 μm), while the roughness of the GaAs surface after the treatment according to embodiments of the present invention is 0.157 nm RMS (2 μm×2 μm).

According to embodiments of the present invention, the contamination removal treatment may be followed by a polishing step with, for example, ammonium peroxide solution (NH$_4$OH/H$_2$O$_2$/H$_2$O with a volume ratio of 40/4/1). The roughness of the GaAs substrate achieved after treatment with ammonium peroxide is only slightly better than that of the original sample. As shown in TABLE 3 (indicated by SPM+APM (ammonium peroxide mixture)) the final roughness after the extra polishing step may be 0.144 nm RMS (2 μm×2 μm). This slight improvement shows that, when III-V substrates are treated with the single-step method according to embodiments of the present invention, it is not necessary to add an extra polishing step to the method.

TABLE 3

Surface roughness of GaAs substrates after treatment with the method according to embodiments of the invention.

| Sample label | Grid size (μm × μm) | Roughness RMS (nm) |
| --- | --- | --- |
| GAS_W14-before | 2 μm × 2 μm | 0.243 |
| GAS_W14-before | 10 μm × 10 μm | 0.277 |
| GAS_W14-after SPM | 2 μm × 2 μm | 0.157 |
| GAS_W14-after SPM | 10 μm × 10 μm | 0.139 |
| GAS_W14-after SPM + APM | 2 μm × 2 μm | 0.144 |
| GAS_W14-after SPM + APM | 10 μm × 10 μm | 0.141 |

From the above it may be concluded that both the surface roughness and the metal contamination removal performance of III-V semiconductor substrates treated with the single step bulk contamination removal treatment according to embodiments of the present invention are complying with the requirements of the most advanced applications in, for example, semiconductor processing.

According to other embodiment of this invention, the effect of the different compositions of the mixtures of sulfuric acid and peroxide was investigated. The temperature of the mixture was in all cases 90° C. and the mixtures were stirred with a magnetic stirrer at 170 RPM.

Samples labeled GAS_W15 to GAS_W18 were treated with different concentrations of the H$_2$SO$_4$:H$_2$O$_2$ mixture, the volume ratio ranging from 9:1 to 5:5 (see TABLE 2). All the mixtures were tested at 90° C. for a time ranging from 30 s to 3 minutes, such that, depending on the etch rate obtained, substantially 10 microns of the substrate was removed for each sample. The etch rate was found to increase with increasing H$_2$O$_2$ concentration.

When using a mixture of sulfuric acid and peroxide with a volume ratio of 9:1, an etch rate of 2.97 μm/min may be obtained (see TABLE 2, sample GAS_W15). However, optical microscope measurements show that the GAS_W15 sample shows some stripes on the surface, most probably originating from a non-uniform high etch rate. Although the GAS_W15 sample shows under the microscope an acceptable surface quality in terms of roughness, the non-uniformity after etch may be too high for being used in a manufacturing process of, for example, semiconductor devices.

As can furthermore be seen from TABLE 2, the etch rates of the samples GAS_W16 to GAS_W18 which are treated with mixtures having a volume ratio of respectively 7:3, 6:4 and 5:5 and thus more dilute H$_2$SO$_4$ solutions than the 9:1 solution, are between 10.15 μm/min and 28.12 μm/min, values which may be too high to assure a good control of the process. Therefore, methods according to embodiments of the invention with such parameters are less suitable to be used in semiconductor processing.

Samples GAS_W16 to GAS_W18, treated with more dilute H$_2$SO$_4$ solutions, even visually show an unacceptable high roughness. Because of the very high etch rate in these three cases, oxides are most probably formed at a very high rate, higher than their removal rate, leaving behind a hazy surface. The hazy appearance of the wafers may increase by further diluting the H$_2$SO$_4$ solution with H$_2$O$_2$.

Microscope inspection of the samples GAS_W16 to GAS_W18 confirms the high roughness and particle-like residues on the surface. These particle-like residues can be related to the oxide formed during treatment that cannot be removed from the surface in due time.

Because of the high etch rate values, the control of the etch depth by stirring becomes very difficult.

According to further embodiments of this invention the effect of water addition on both the etch rate and the morphology of the treated wafers was investigated. Different H$_2$SO$_4$:H$_2$O$_2$:H$_2$O volume ratios were investigated at room temperature, with and without stirring, as shown in TABLE 2.

Samples GAS_W19 to GAS_W22 were treated in H$_2$SO$_4$:H$_2$O$_2$:H$_2$O solutions with different volume ratios at room temperature (23° C. to 28° C.) with or without stirring as shown in TABLE 2. The treatment time was chosen between 1 min 30 s for H$_2$SO$_4$:H$_2$O$_2$:H$_2$O mixture with a ratio of 22:40:38 with stirring, to 9 min for the unstirred H$_2$SO$_4$:H$_2$O$_2$:H$_2$O mixture with a ratio of 45:20:35, such that in all cases substantially 10 microns of the substrate is removed. As previously, for each experiment a 3 minute DIW rinse was given with a quick dump rinse every minute.

Visually, three of the four wafers were very hazy most probably because of the oxides present on the substrates. Only one of the wafers, i.e. sample GAS_W21, had a mirror-like surface, but showed a lot of etch pits. The etch rates show values varying from 2.36 μm/min for sample GAS_W21 to 8.96 μm/min for sample GAS_W20 as can be seen in TABLE 2.

Figure 2:
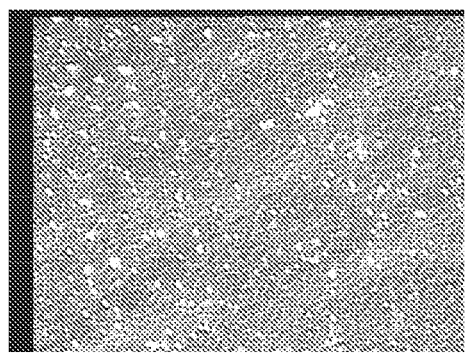
FIG. 2 shows microscope images of the samples GAS_W19 (a), GAS_W20 (b), GAS_W21 (c) and GAS_W22 (d) after the sulfuric peroxide treatment.
Figure 2:
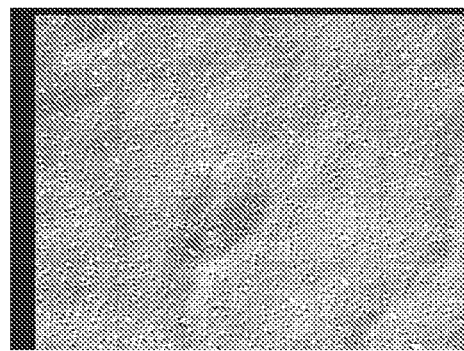
Figure 2:
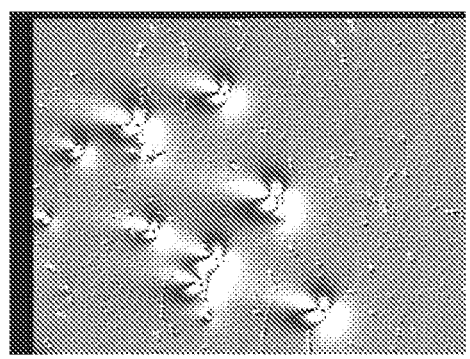
Figure 2:
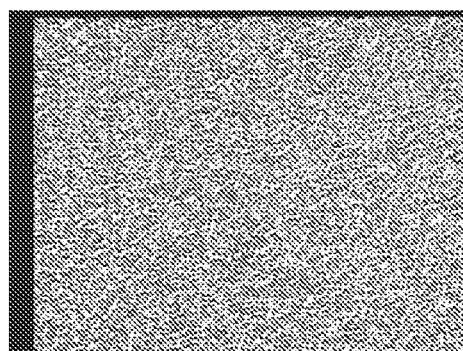

FIG. 2 shows the optical microscope images of samples GAS_W19 to GAS_W22. The images are on a scale of 630 μm×490 μm. As can be seen, all the wafers are very rough, with values as shown below in Table 4 for GAS_W20 (FIG. 2(b)) and GAS_W21 (FIG. 2(c)), much higher that those for sample GAS_W14 (Table 3). Moreover, a particle-like contamination is present on three wafers, i.e. on samples GAS_W19 (FIG. 2(a)), GAS_W20 (FIG. 2(b)) and GAS_W22 (FIG. 2(d)). Sample GAS_W21 (FIG. 2(c)) seems visually to be less rough, however the presence of etch pits is noticed.

Only the samples showing a better roughness under the optical microscope, i.e. samples GAS_W20 and GAS_W21, were measured with AFM. The roughness values extracted from the AFM photos are summarized in TABLE 4.

TABLE 4

Surface roughness of GaAs substrates after treatment with the method according to embodiments of the invention.

| Sample label | Position, Grid size | RMS (nm) |
|---|---|---|
| GAS_W20 | Center, 2 μm × 2 μm | 14.439 |
| | Left, 2 μm × 2 μm | 8.670 |
| | Right, 2 μm × 2 μm | 4.158 |
| GAS_W21 | Center, 10 μm × 10 μm | 3.905 |
| | Center, 2 μm × 2 μm | 1.598 |
| | Left, 10 μm × 10 μm | 3.957 |
| | Left, 2 μm × 2 μm | 2.078 |
| | Right, 10 μm × 10 μm | 2.983 |
| | Right, 2 μm × 2 μm | 1.694 |

All mixtures, irrespective of the volume ratio $H_2SO_4$:$H_2O_2$:$H_2O$ do, however, remove substantially completely the metal contamination, e.g. noble metal contamination, from the wafers, providing that a thick enough layer is etched or in other words, that the time during which the substrates are immersed in the sulfuric acid/peroxide mixture, the temperature of the mixture and the volume ratio of the mixture are such that a layer of, e.g., 10 μm to 15 μm of substrate is removed.

The metal contaminant concentration on the GaAs substrate after treatment is summarized in TABLE 5. All the wafers have undetectable Cu levels. The Ca contamination on the wafers can originate from a DIW bath. The higher Fe and Ni values obtained for the GAS_W21 sample may be due to an accidental local contamination by wafer handling.

Although all the mixtures tested show good, i.e. low, metal contamination concentrations after treating them with the method according to embodiments of the present invention, the roughness of the samples GAS_W15 to GAS_W22 is very high, which makes them less appropriate for further processing. Thus, the addition of water to a mixture consisting of sulfuric acid and peroxide leads to higher roughness, to the presence of a particle-like contamination and/or formation of etch pits. Therefore the mixtures containing additional water are less suitable for single step contamination removal treatment in, for example, semiconductor processing.

Summarized it can be said that immersing the semiconductor, e.g. GaAs, wafers in a mixture consisting of sulfuric acid and peroxide with a volume ratio of sulphuric acid to peroxide of between about 3:1 and about 9:1, or between about 4:1 and about 6:1, leads to semiconductor substrate surfaces with a metal bulk contamination lower than the detection limit of a detection method and/or detection device for the relevant metal and with a surface roughness of lower than 0.5 nm RMS, preferably lower than 0.3 nm RMS and most preferably lower than 0.2 nm RMS for a surface grid of 2 μm×2 μm.

In some embodiments, the temperature of the sulfuric acid/peroxide mixture may be between about 45° C. and about 95° C., or between about 80° C. and about 95° C., depending on whether the mixture is stirred or not, or whether it is mechanically agitated. In typical embodiments, the method may be performed at an etch rate of between about 2 and about 6 μm/min. The etch rate depends on the volume ratio of the sulfuric acid/peroxide mixture, on the temperature of the mixture and on whether the mixture is stirred or not, or whether it is mechanically agitated.

The methods according to embodiments of the present invention lead to semiconductor substrates showing no or substantially no bulk metal contamination while having a surface roughness of lower than 0.5 nm RMS, preferably lower than 0.3 nm RMS and most preferably lower than 0.2 nm RMS for a surface grid of 2 μm×2 μm without the requirement of additional polishing steps. With no or substantially no bulk metal contamination is meant that the concentration of the metal contaminant after treating with the methods according to embodiments of the present invention is as low as possible, preferably lower than the detection limit of a detection method and/or detection device for the relevant metal contaminant.

It is to be understood that although preferred embodiments, specific constructions and configurations, as well as materials, have been discussed herein for devices according to the

TABLE 5

Metal contaminant concentration after treatment of the GaAs substrates with a method according to embodiments of the present invention (all data are expressed in $1 \times 10^{10}$ at/cm$^2$).

| Sample Label | K | Ca | Ti | Cr | Fe | Co | Ni | Cu |
|---|---|---|---|---|---|---|---|---|
| GAS_W19 | <DL | 38.22 ± 66.2 | <DL | <DL | 29 ± 3.7 | <DL | 10.54 ± 9.67 | <DL |
| GAS_W20 | <DL | <DL | <DL | <DL | 13.54 ± 6.76 | <DL | 8.73 ± 2.85 | <DL |
| GAS_W21 | <DL | 25.56 ± 26.81 | <DL | <DL | 114.46 ± 173.3 | <DL | 61.43 ± 93.47 | <DL |
| GAS_W22 | <DL | <DL | <DL | <DL | <DL | <DL | 3.35 ± 5.8 | <DL |
| Detection Limit (DL) | 15 | 9 | 6 | 5 | 10 | 5 | 10 | 5 |

The invention claimed is:

1. A method for removing bulk metal contamination from a III-V semiconductor substrate, the method comprising:
   immersing a contaminated III-V semiconductor substrate in a mixture consisting of sulfuric acid and peroxide, wherein the sulfuric acid is a 96 wt % aqueous solution of sulfuric acid, and wherein the peroxide is a 30 wt % aqueous solution of hydrogen peroxide,
   wherein a volume ratio of sulfuric acid to peroxide in the mixture consisting of sulfuric acid and peroxide is between about 3:1 and about 9:1, and wherein the III-V semiconductor substrate comprises a material selected from the group consisting of GaAs, GaP, GaSb, InAs, InP, InSb, and combinations thereof.

2. The method according to claim 1, wherein the volume ratio of sulfuric acid to peroxide in the mixture consisting of sulfuric acid and peroxide is between about 4:1 and about 6:1.

3. The method according to claim 1, wherein the volume ratio of sulfuric acid to peroxide in the mixture consisting of sulfuric acid and peroxide is about 4:1.

4. The method of claim 1, wherein the mixture of sulfuric acid and peroxide has an etch rate between about 2 µm/min and about 6 µm/min.

5. The method of claim 1, further comprising stirring the mixture consisting of sulfuric acid and peroxide during immersion of the contaminated III-V semiconductor substrate in the mixture consisting of sulfuric acid and peroxide.

6. The method of claim 1, further comprising mechanically agitating the mixture consisting of sulfuric acid and peroxide during immersion of the contaminated III-V semiconductor substrate in the mixture consisting of sulfuric acid and peroxide.

7. The method of claim 1, wherein the mixture consisting of sulfuric acid and peroxide has a temperature of between about 45° C. and about 95° C.

8. The method of claim 7, wherein the mixture consisting of sulfuric acid and peroxide has a temperature of between about 80° C. and about 95° C.

9. The method of claim 1, further comprising, before immersing the contaminated III-V semiconductor substrate in the mixture consisting of sulfuric acid and peroxide, freshly preparing the mixture consisting of sulfuric acid and peroxide, wherein freshly preparing the mixture comprises:
   (a) preparing a freshly prepared mixture by mixing sulfuric acid and peroxide in a volume ratio of sulfuric acid to peroxide of between about 3:1 and about 9:1; and (b) while stirring, cooling down the freshly prepared mixture to obtain a homogeneous temperature distribution.

10. The method of claim 9, wherein the III-V semiconductor substrate comprises GaAs.

11. The method of claim 1, wherein the III-V semiconductor substrate is contaminated by a metal bulk contamination comprising a metal selected from the group consisting of Au, Ag, Pt, Cu, Fe, Ni, and Zn.

12. The method of claim 11, wherein the metal bulk contamination comprises Cu.

13. The method of claim 1, wherein the peroxide is hydrogen peroxide.

14. A method for manufacturing a semiconductor device, the method comprising:
   before performing further processing steps to manufacture the semiconductor device: (a) providing a contaminated III-V semiconductor substrate, wherein the contaminated III-V semiconductor substrate comprises a material selected from the group consisting of GaAs, GaP, GaSb, InAs, InP, InSb, and combinations thereof; and (b) immersing the contaminated III-V semiconductor substrate in a mixture consisting essentially of sulfuric acid and peroxide, wherein a volume ratio of sulfuric acid to peroxide in the mixture comprising sulfuric acid and peroxide is between about 3:1 and about 9:1, wherein the sulfuric acid is a 96 wt % aqueous solution of sulfuric acid, and wherein the peroxide is a 30 wt % aqueous solution of hydrogen peroxide.

15. A method for removing bulk metal contamination from a III-V semiconductor substrate, the method comprising:
   immersing a contaminated III-V semiconductor substrate in a mixture consisting of sulfuric acid and peroxide, wherein the sulfuric acid is a 96 wt % aqueous solution of sulfuric acid, and wherein the peroxide is a 30 wt % aqueous solution of hydrogen peroxide,
   wherein a volume ratio of sulfuric acid to peroxide in the mixture comprising sulfuric acid and peroxide is between about 3:1 and about 9:1, and wherein the III-V semiconductor substrate comprises a material selected from the group consisting of GaAs, GaP, GaSb, InAs, InP, InSb, and combinations thereof.

* * * * *